United States Patent [19]

Ostendorf

[11] Patent Number: 5,708,568
[45] Date of Patent: Jan. 13, 1998

[54] ELECTRONIC MODULE WITH LOW IMPEDANCE GROUND CONNECTION USING FLEXIBLE CIRCUITS

[75] Inventor: Dennis Ostendorf, Rockford, Ill.

[73] Assignee: Sundstrand Corporation, Rockford, Ill.

[21] Appl. No.: 664,756

[22] Filed: Jun. 17, 1996

[51] Int. Cl.$^6$ .................. H05K 7/02; H05K 7/14; H05K 9/00; H05K 1/00
[52] U.S. Cl. ............... 361/749; 361/753; 361/799; 361/818; 174/35 R; 174/51; 174/254; 439/95
[58] Field of Search ............... 361/749, 750, 361/751, 789, 799, 800, 816, 818, 753, 821; 174/254, 268, 35 R, 51; 439/92, 95–99, 67, 77, 947

[56] References Cited

U.S. PATENT DOCUMENTS

| 4,533,188 | 8/1985 | Miniet | 439/77 |
|---|---|---|---|
| 4,571,663 | 2/1986 | McPherson | 361/735 |
| 4,628,411 | 12/1986 | Balderes et al. | 361/794 |
| 5,134,252 | 7/1992 | Himeno et al. | 174/268 |
| 5,220,488 | 6/1993 | Denes | 361/749 |
| 5,224,023 | 6/1993 | Smith et al. | 174/254 |
| 5,266,746 | 11/1993 | Nishihara et al. | 174/254 |
| 5,296,651 | 3/1994 | Gurrie et al. | 174/254 |
| 5,313,416 | 5/1994 | Kimura | 361/749 |
| 5,363,275 | 11/1994 | Frankeny et al. | 361/749 |
| 5,388,030 | 2/1995 | Gasser et al. | 361/818 |
| 5,497,037 | 3/1996 | Lee et al. | 361/794 |
| 5,519,578 | 5/1996 | Fujii | 361/749 |
| 5,615,088 | 3/1997 | Mizumo | 361/749 |

*Primary Examiner*—Leo P. Picard
*Assistant Examiner*—John B. Vigushin
*Attorney, Agent, or Firm*—Antonelli, Terry, Stout & Kraus

[57] ABSTRACT

An electronic module, particularly an electromagnetic interference module includes an assembly for providing a low impedance ground path for at least one electrical component on a printed circuit board of the module. A chassis of the module is employed as a ground source. The printed circuit board is a rigid flex printed circuit board constructed of multiple circuit layers including flexible and rigid circuit layers. The board has at least one rigid portion with both flexible and rigid circuit layers and at least one flexible portion constructed of at least one flexible circuit layer. An electrical component to be grounded is located on a rigid portion of the board. A flexible circuit layer of the rigid flex printed circuit board is used as a return making a direct ground path from the rigid flex printed circuit board to the chassis for grounding the electrical component.

16 Claims, 10 Drawing Sheets

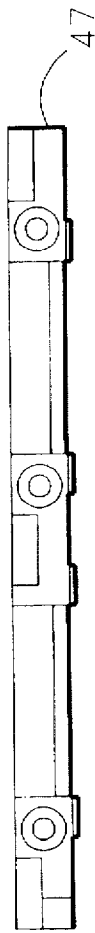
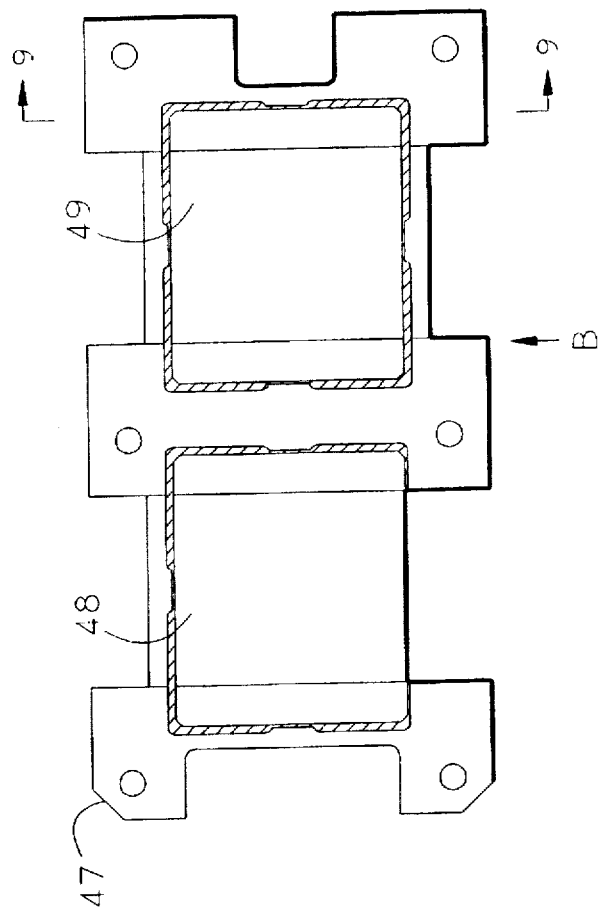
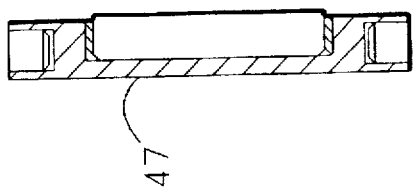

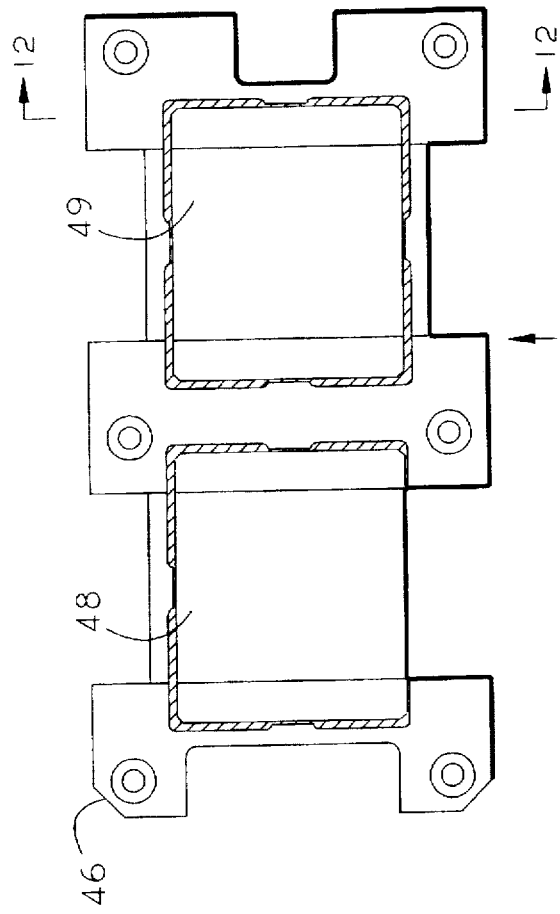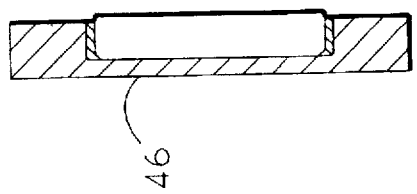

ELECTRONIC MODULE WITH LOW IMPEDANCE GROUND CONNECTION USING FLEXIBLE CIRCUITS

This invention was made with Government support under prime contract P7729254 awarded by the Department of Army. The Government has certain rights in this invention.

FIELD OF INVENTION

The present invention is directed to an improved assembly for providing a low impedance ground path for at least one component on a printed circuit board and, more particularly, to an electromagnetic interference module providing a low impedance ground path for at least one capacitor on a printed circuit board. A method of assembling an electronic module is also disclosed.

BACKGROUND AND SUMMARY OF INVENTION

Electrical signals require filtering to keep the signals clean. Often, capacitors are used to help filter the signals. The capacitors require a low impedance path for a ground. If the capacitors are mounted onto a printed circuit board, see capacitors 21 mounted on printed circuit board 20 in FIGS. 1A and 1B, the ground connection is typically made by a short piece of copper wire, or a braided wire at 23 as depicted in FIG. 1B of the drawings. The problems with this type of connection include: (1) that the wire length can become long thereby increasing impedance; (2) two joints are required to make the connection, one at the printed circuit board and one at the chassis, which increases impedance; and (3) multiple wires may be needed which increases assembly time and cost.

There is a need for an improved assembly for providing a low impedance ground path for electrical components such as capacitors on a printed circuit board, which assembly and the related method avoid the aforementioned disadvantages of the conventional arrangement for grounding capacitors as depicted in FIGS. 1A and 1B.

An object of the present invention is to provide an improved assembly for providing a low impedance ground path for at least one component on a printed circuit board which advantageously permits deletion of one of the two connections that is typically required, provides the shortest path possible for grounding the capacitors on the printed circuit board and increases available grounding area.

An assembly for providing a low impedance ground path for at least one component on a printed circuit according to the invention comprises a ground source and a rigid flex printed circuit board constructed of multiple circuit layers including flexible and rigid circuit layers. The board is formed with at least one rigid portion having both flexible and rigid circuit layers and at least one flexible portion constructed of at least one flexible circuit layer. At least one component to be grounded is located on a rigid portion of the board. A flexible circuit layer of the rigid flex printed circuit board is extended as part of the original printed circuit board design and is used as a return making a direct ground path from the rigid flex printed circuit board to the ground source for grounding the component. The flexible circuit layer used as a return extends outwardly from a rigid portion of the rigid flex printed circuit board in the disclosed embodiment. More specifically, a flexible circuit layer used as a return extends outwardly from each of two opposite sides of a rigid portion of a rigid flex printed circuit board to form grounding ears which each make a direct ground path from the rigid flex printed circuit board to the ground source.

The ground ears are each bent out of a plane of the rigid portion of the rigid flex printed circuit board. Each ground ear contacts a respective side wall of a chassis of the assembly as the ground source. Thus, the ground source is a structural support for the rigid flex printed circuit board.

According to a further feature of the invention, the return comprises a laminate including a flexible conductive layer and a flexible insulating layer. The flexible conductive layer is secured against the ground source to provide the low impedance ground path. A portion of the flexible insulating layer of the return extends beyond the bounds of the flexible conductive layer thereof and is secured to a fixturing member on a rigid portion of the rigid flex printed circuit board for positioning the conductive flexible layer of the return during construction of the assembly and making the grounding connection between the flexible conductive layer of the return and a side wall of the chassis. The fixturing member in the disclosed, preferred embodiment is a ferrite core holder mounted on a rigid portion of the rigid flex printed circuit board. The ferrite core holder and the ferrite cores supported therein are connected to the chassis with fasteners during construction of the assembly. A flexible conductive layer of the return is sandwiched between the ferrite core holder and the chassis for making the ground connection with the chassis during construction of the assembly.

The flex printed circuit board disclosed herein comprises first and second rigid portions each having both flexible and rigid circuit layers, the first and second rigid portions being spaced from one another with a flexible portion or layers of the rigid flex printed circuit board extending therebetween. When assembled, the circuit board is folded on itself from a flat position such that the first and second rigid portions are arranged in a stacked relationship to one another and connected to each other by the flexible portion extending therebetween. This assembly in the disclosed embodiment is an electromagnetic interference module in which a low impedance ground path is provided for a plurality of capacitors on the printed circuit board.

A method of assembling an electronic module according to the invention wherein at least one electrical component on a printed circuit board of the module is provided with a low impedance ground path, comprises the steps of providing a chassis for supporting a rigid flex printed circuit board; and supporting a rigid flex printed circuit board constructed of multiple circuit layers including flexible and rigid circuit layer on the chassis, the board being formed with at least one rigid portion having both flexible and rigid circuit layers and at least one flexible portion constructed of at least one flexible circuit layer, at least one electrical component to be grounded being located on a rigid portion of the board, and wherein a flexible circuit layer of the rigid flex printed circuit board is contacted with and connected to the chassis as a return making a direct ground path from the rigid flex printed circuit board to the chassis for grounding the electrical equipment. The method also includes the step of positioning the return on a fixturing member attached to the board before contacting and connecting the return to the chassis.

These and other objects, features and advantages of the present invention will become more apparent from the following detailed description of a disclosed, preferred embodiment of the invention as illustrated in the accompanying drawings.

BRIEF DESCRIPTION OF DRAWINGS

FIG. 7 is a top view of a bottom ferrite core holder;

FIG. 8 is a side view of the ferrite core holder of FIG. 7 taken in a direction of arrow B in FIG. 7;

FIG. 9 is an end view of the left end of the ferrite core holder of FIG. 7;

FIG. 10 is bottom view of a top of a ferrite core holder;

FIG. 11 is a side view of the ferrite core holder of FIG. 10 taken in the direction of arrow C;

FIG. 12 is an end view of the left end of the ferrite core holder of FIG. 10;

DETAILED DESCRIPTION OF DISCLOSED EMBODIMENT

Figure 4:
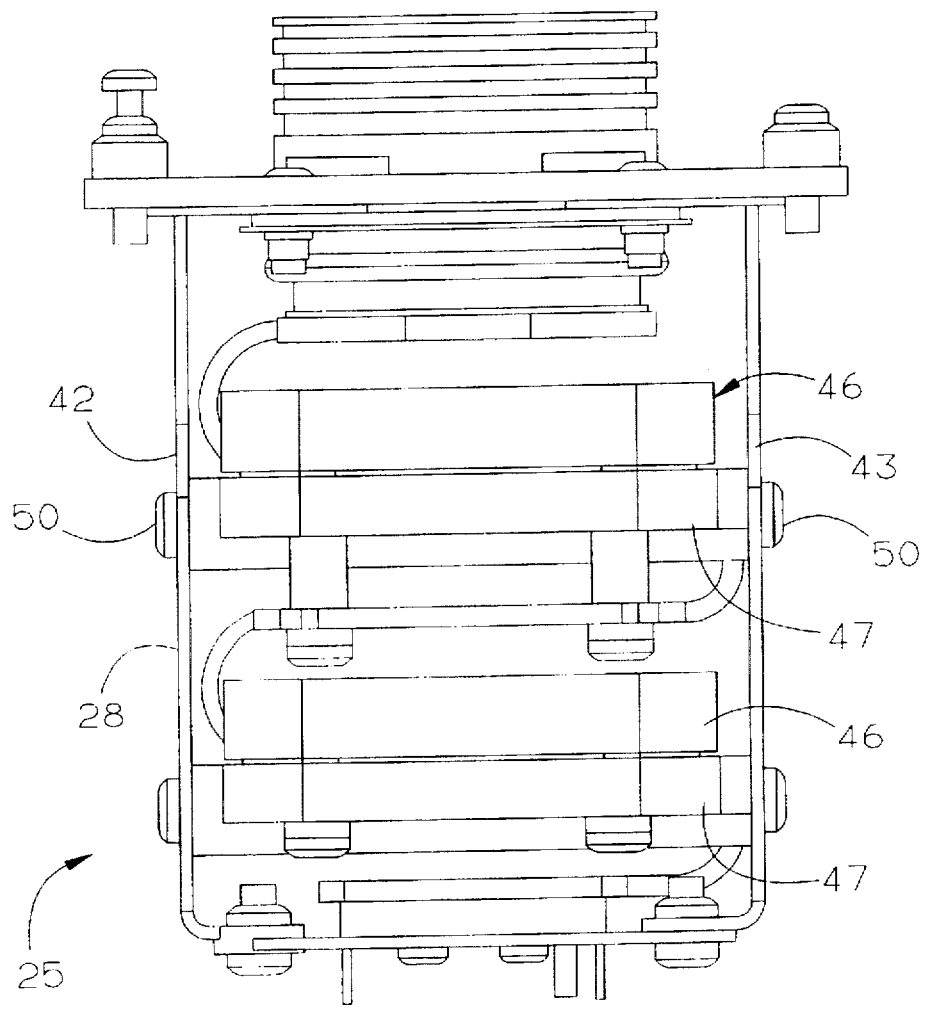
FIG. 4 is a end view of an assembly of a module according to the invention wherein the folded printed circuit board of FIG. 3 is mounted within and ground connected to a chassis.
Figure 13:
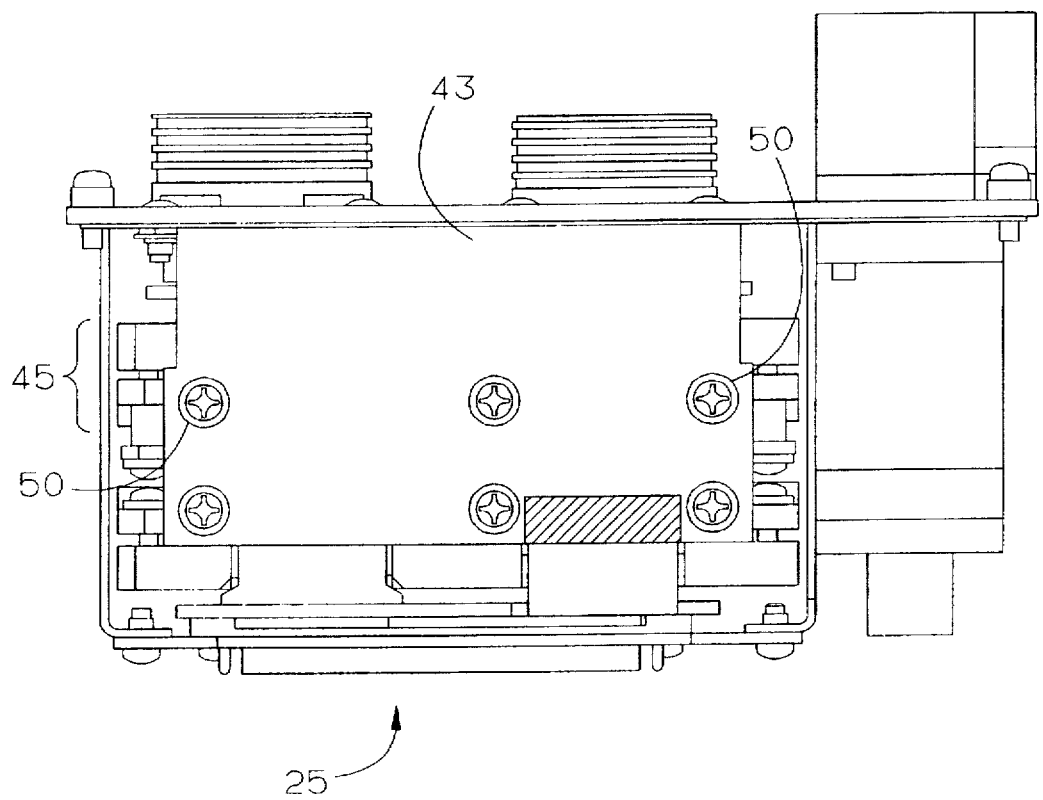
FIG. 13 is a side elevational view, partially in cross section, of the module assembly of FIG. 3.
Figure 14:
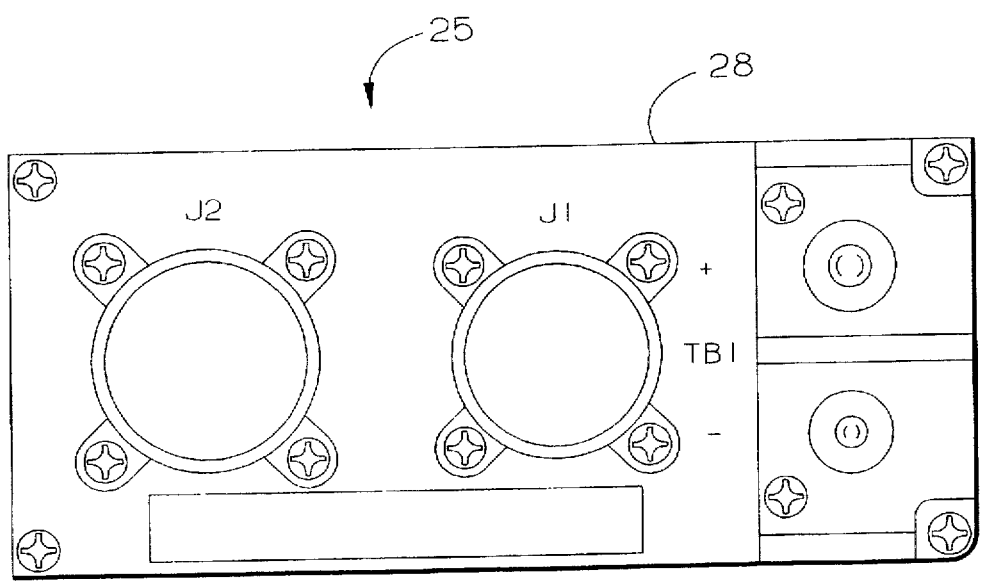
FIG. 14 is a top view of the module of FIG. 13 showing the chassis and circular electrical connectors on the rigid flex printed circuit board extending therethrough.

Referring now to the drawings, an assembly 25 according to the invention is depicted in FIGS. 4, 13 and 14. The assembly is in the form of an electromagnetic interference module useful on an aircraft, for example. The assembly or module 25 comprises a plurality of capacitors 26 mounted on a printed circuit board 27 of the assembly. The capacitors filter electrical signals to keep the signals clean. The capacitors require a low impedance path for ground. The chassis 28 of the assembly 25 is a ground source. A low impedance path for the capacitors 26 to the chassis 28 is provided according to the invention through the use of a rigid flex printed circuit board as the printed circuit board 27 provided with an individual flexible circuit layer extended to provide a ground ear or ears.

Figure 5:
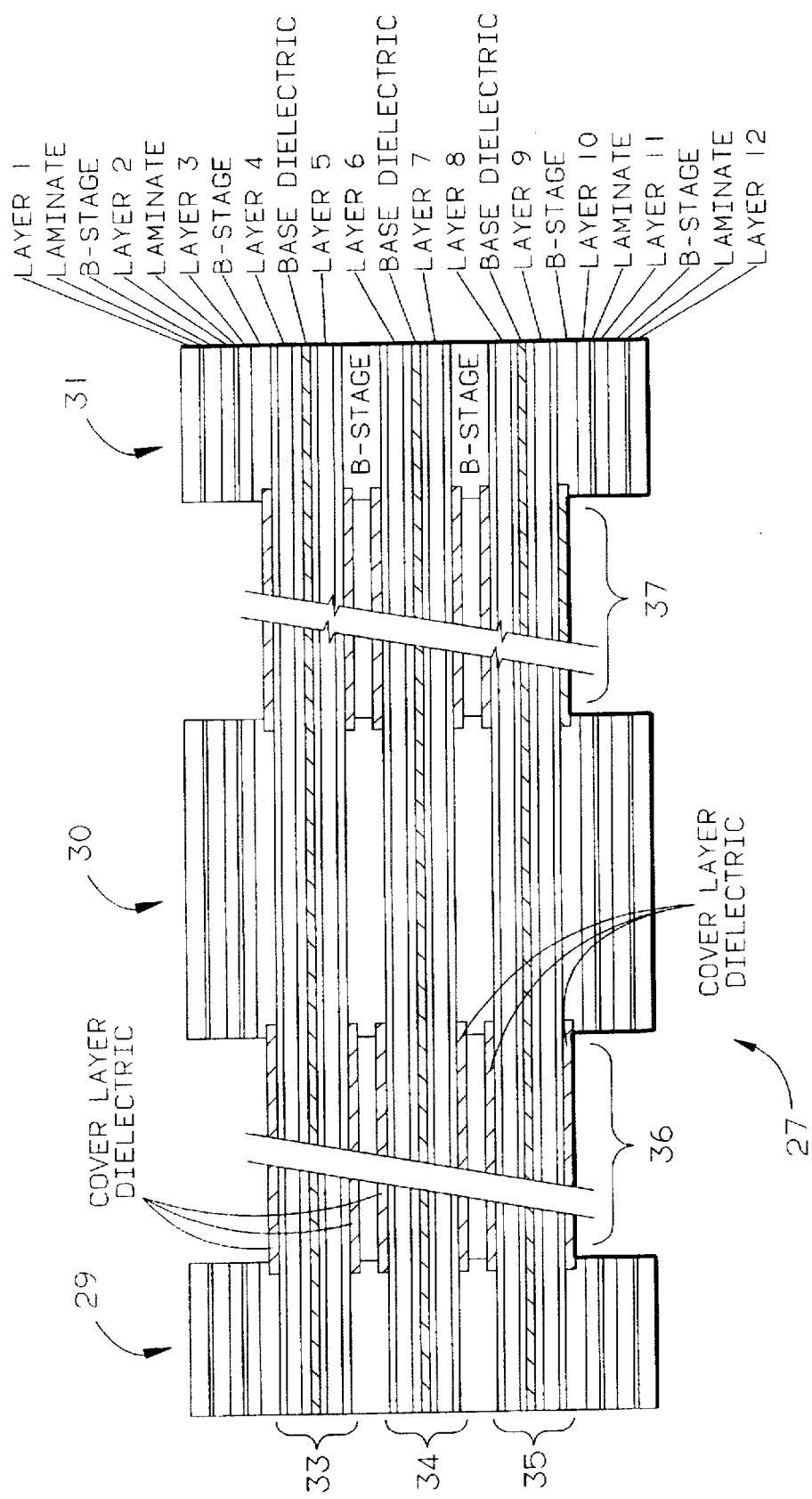
FIG. 5 is an enlarged cross section, not to scale, of the rigid flex printed circuit board of FIG. 2 taken along the section line V—V in FIG. 2.

The rigid flex printed circuit board 27 is constructed of multiple layers, for example, six to ten layers, see FIG. 5. Some of the layers are flexible while the location where components are typically rigid. The flexible layers utilize a thin sheet of polyimide film, 0.001–0.002 inch thick, for example, with copper bonded to it while the rigid layers utilize a thicker epoxy glass substrate, 0.004–0.005 inch, for example, with copper attached. Layers 1–12 in FIG. 5 are copper bonded to either a thin sheet of polyamide film or a thicker epoxy glass substrate. The copper can be one ounce or two ounce copper having a thickness of 0.0028 inch, for example.

Figure 2:
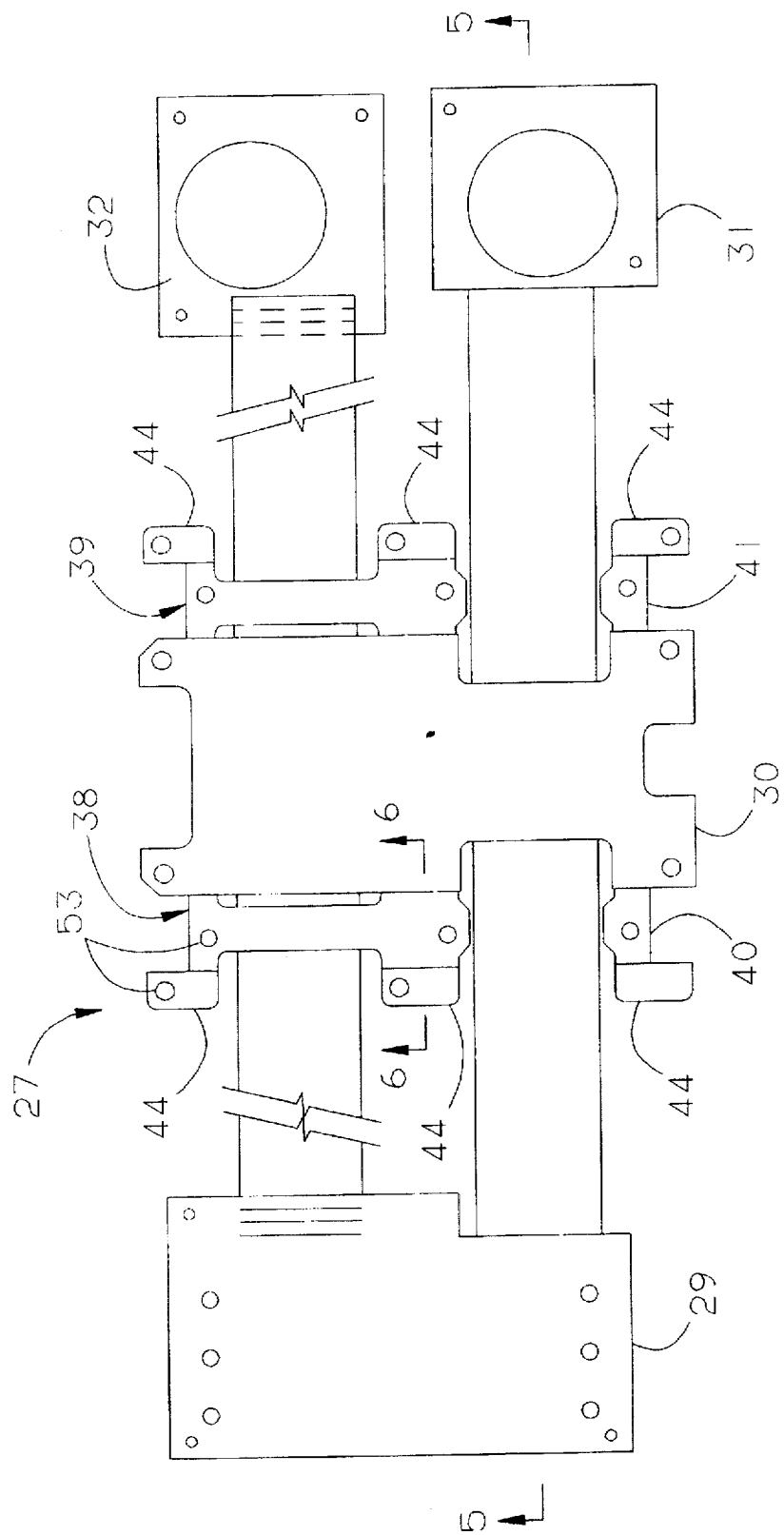
FIG. 2 is a top plan view of a rigid flex printed circuit board according to a preferred embodiment of the invention.
Figure 3:
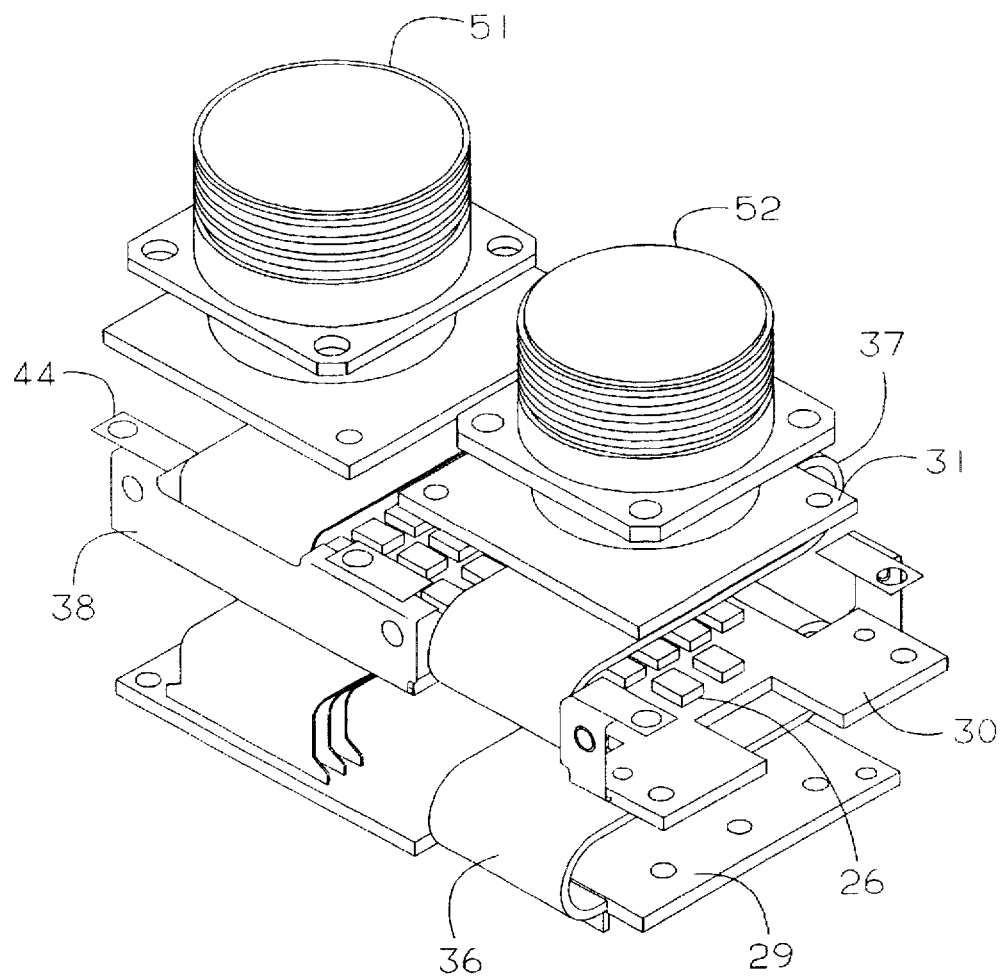
FIG. 3 is a perspective view of the rigid flex printed circuit board of FIG. 2 folded on itself in the manner in which it is to be arranged in a chassis in a stacked configuration, electrical components being shown on rigid portions thereof.

A top view of the flat rigid flex printed circuit board 27 appears in FIG. 2. The board 27 is formed with rigid locations 29–32 formed of both flexible and rigid circuit layers with copper bonded to either a thin sheet of polyimide film or a thicker epoxy glass substrate using an acrylic adhesive bond. A B-stage adhesive is used to laminate the flexible and rigid circuit layers to one another in the rigid locations 29–32 of the board 27. Flexible circuit layers 33, 34 and 35 are located in and extend between rigid locations 29, 30 and 31 forming flexible portions 36 and 37 of the board 27 between the rigid locations. This permits the board to be folded on itself with the respective rigid locations being arranged in a stack as shown in FIG. 3. Each of the flexible circuit layers 33–35 has a central base dielectric in the form of a polyimide film. Copper conductors are bonded to each of the two opposite surfaces of the polyamide film. A cover layer of dielectric is provided over the outer surfaces of the copper between the rigid locations of a board for protection and insulation of the conductors.

Figure 6:
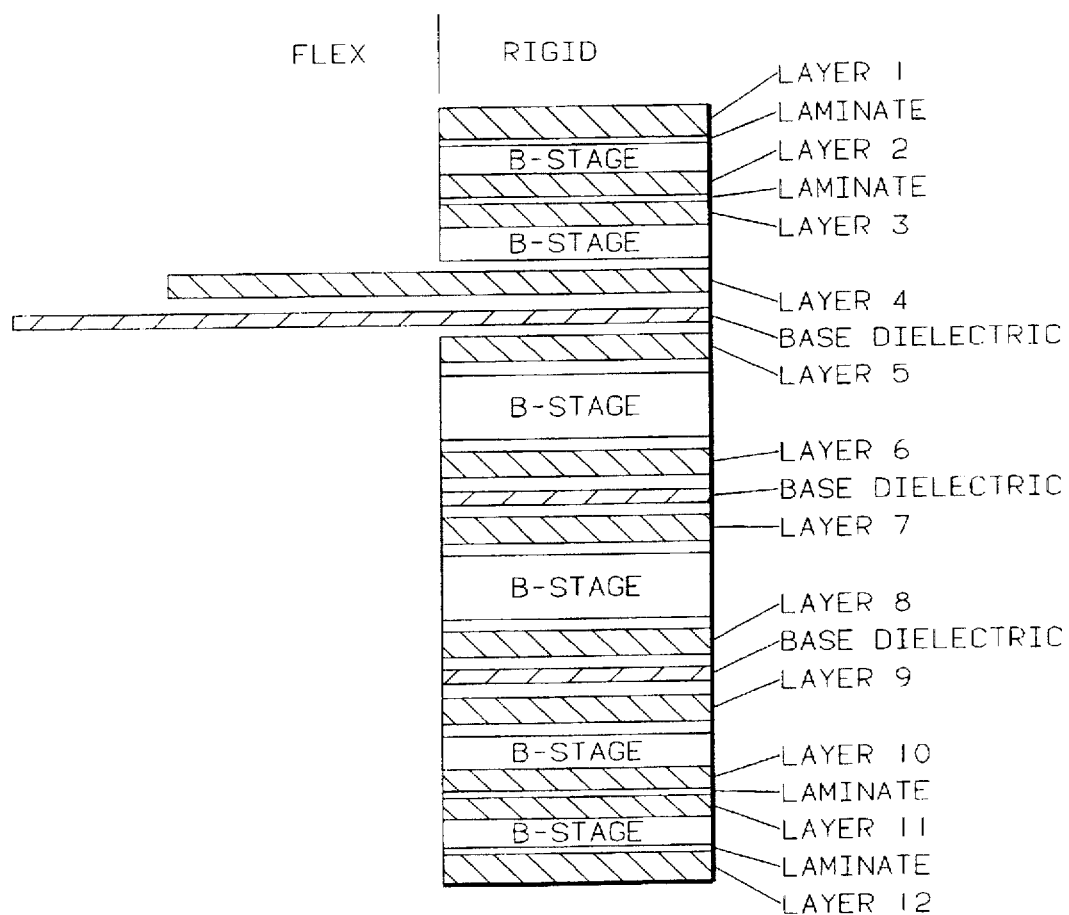
FIG. 6 is a cross sectional view of a portion of a rigid flex printed circuit board of the invention, not to scale, taken along sectional line VI—VI in FIG. 2.

According to the invention, a layer of the printed circuit board, a flexible layer, is extended out from a rigid location 30 to serve as ground connectors, e.g. grounding ears 38, 39, 40 and 41. For this purpose an individual flexible circuit layer 4, as shown in FIGS. 5 and 6, is extended outwardly from each of two opposite sides of the rigid location 30 along with a base dielectric of a polyamide film. The copper of the grounding ear is exposed. The grounding ear is folded over with respect to the rigid location 30 of the board such that the exposed copper conductor will contact an adjacent side wall, 42 or 43 of chassis 28 during assembly for use as a ground path for components such as capacitors 26 mounted on rigid location 30 of the board.

The ground ears provide a low impedance ground path. Prior to assembly, polyamide film extensions 44, extending beyond the bounds of the copper layer 4 thereon, are folded back and connected by means of screws to a ferrite core assembly 45 formed of upper and lower ferrite core holders 46 and 47 which support ferrite cores 48 and 49 between which flexible circuit layers 33, 34, and 35 extend in an area located between rigid board locations 30, and 31 and 32, see FIGS. 2 and 3. By these extensions 44, the ground ears are fastened to the ferrite core holder and then mounted to the chassis side walls using threaded fasteners 50 extending between the side walls 42 and 43 of the chassis and threaded apertures in the lower ferrite core holder 47 of the ferrite core assembly. This effectively supports the ferrite core assembly on the chassis and firmly clamps the ground ear against the sidewall of the chassis. The use of the ground ears is advantageous in that it eliminates one of the two connections that is typically required as noted with respect to the prior art of FIGS. 1A and 1B. It provides the shortest path possible since it is one of the layers within the printed circuit board, and it increases the available bonding area. It is desired that the cross sectional area of the ground be as large as possible. While the elongated ground ears 38 and 39 are each connected at only two locations to the side walls 42 and 43 using fasteners 50, the pressure of the adjacent ferrite core holder urging the ground ears against the side wall makes it likely that the grounding ear is in good conductive contact with the chassis side wall or ground source over most of its length.

The ferrite cores in the module 25 are part of the circuit design for filtering noise out. They act as an inductor. However, as noted above, the associated ferrite core holder also serves as a fixturing member for positioning the grounding ears during assembly of the module. Circular electrical connecters 51 and 52 are connected to the top of the upper most rigid locations 31 and 32 and protrude out of corresponding openings in the chassis 28 as shown in FIGS. 4, 13, and 14. Fastener holes 53 are formed in the grounding ears and the extensions 44 thereof to permit the aforementioned connections.

Figure 1A:
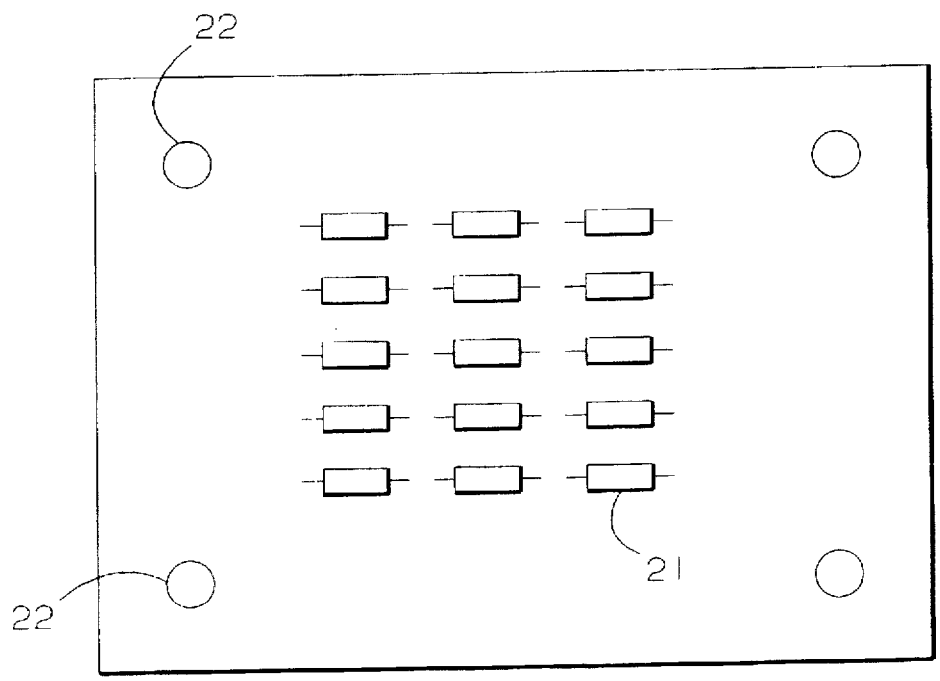
FIG. 1A is a top view of a conventional printed circuit board with capacitors and terminal posts to which wires can be connected for providing a ground connection for the capacitors.
Figure 1B:
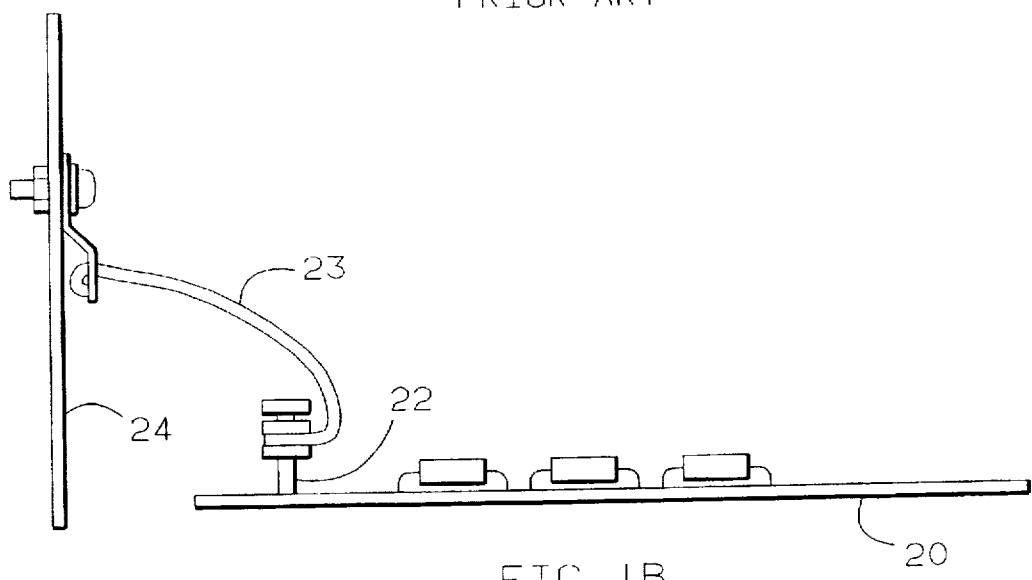
FIG. 1B is a side view of the printed circuit board of FIG. 1A showing a conventional arrangement for grounding the capacitors on the board by use of a conductor wire connected to a terminal post of the board and to a chassis as a ground source.

The use of the grounding ear extensions of a flexible circuit layer of the printed circuit board as a return making a direct ground path from the rigid flex printed circuit board to the ground source for grounding electrical components thereon eliminates an interface or connection typically made with the printed circuit board by welding or brazing as discussed with reference to FIGS. 1A and 1B, for example. Thus, the present invention eliminates the problem of a wire length becoming long and increasing impedance as with an arrangement illustrated in FIG. 1B, and eliminates the need for two joints to make the ground connection, one at the printed circuit board and one at the chassis, which increases impedance. The invention also avoids the need for multiple wires which can increase assembly time and cost through the use of a relatively large conductive contact area between the grounding ear and the ground source.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

I claim:

1. An assembly for providing a low impedance ground path for at least one component on a printed circuit board, said assembly comprising:
    a ground source; and
    a rigid flex printed circuit board constructed of multiple circuit layers including flexible and rigid circuit layers, said board being formed with at least one rigid portion having both flexible and rigid circuit layers and at least one flexible portion constructed of at least one flexible circuit layer, wherein at least one component to be grounded is located on a rigid portion of said board, and wherein a flexible circuit layer of said rigid flex printed circuit board is used as a return making a direct ground path from the rigid flex printed circuit board to said ground source for grounding said component.

2. The assembly according to claim 1, wherein said flexible circuit layer used as a return extends outwardly from a rigid portion of said rigid flex printed circuit board.

3. The assembly according to claim 2, wherein a flexible circuit layer used as a return extends outwardly from each of two opposite sides of a rigid portion of said rigid flex printed circuit board to form grounding ears which each make a direct ground path from said rigid flex printed circuit board to said ground source.

4. The assembly according to claim 3, wherein said ground ears are each bent out of a plane of said rigid portion of said rigid flex printed circuit board, each ground ear contacting a respective sidewall of a chassis of said assembly as said ground source.

5. The assembly according to claim 1, wherein said ground source is a structural support for said rigid flex printed circuit board.

6. The assembly according to claim 5, wherein said structural support is a chassis on which said rigid flex printed circuit board is mounted.

7. The assembly according to claim 1, wherein said return comprises a laminate including a flexible conductive layer and a flexible insulating layer, said flexible conductive layer being secured against said ground source to provide said low impedance ground path.

8. The assembly according to claim 7, wherein a portion of said flexible insulating layer of said return extends beyond the bounds of said flexible conductive layer thereof and is secured to a fixturing member on a rigid portion of said rigid flex printed circuit board for positioning said conductive flexible layer of said return during construction of said assembly.

9. The assembly according to claim 8, wherein said fixturing member is a ferrite core holder mounted on said rigid portion of said rigid flex printed circuit board and connected to a structural support for said rigid flex printed circuit board, said structural support serving as said ground source.

10. The assembly according to claim 1, wherein said component is a capacitor.

11. The assembly according to claim 1, wherein said rigid flex printed circuit board comprises at least first and second rigid portions each having both flexible and rigid circuit layers, said first and second rigid portions being spaced from one another with a flexible portion of said rigid flex printed circuit board extending therebetween.

12. The assembly according to claim 11, wherein said rigid flex printed circuit board is folded on itself such that said first and second rigid portions are arranged in a stacked relationship to one another and connected to each other by said flexible portion extending therebetween.

13. An electromagnetic interference module providing a low impedance ground path for at least one capacitor on a printed circuit board thereof, said module comprising:
    a chassis having opposed sidewalls as a ground source;
    a rigid flex printed circuit board constructed of multiple circuit layers including flexible and rigid circuit layers, said board being formed with at least one rigid portion having both flexible and rigid circuit layers and at least one flexible portion constructed of at least one flexible circuit layer, wherein at least one capacitor to be grounded is located on a rigid portion of said board, wherein a flexible portion of said printed circuit board extends through a ferrite core of said module, said ferrite core being supported in a ferrite core holder secured to said chassis, and wherein a flexible circuit layer of said rigid flex printed circuit board is used as a return making a direct ground path from the rigid flex printed circuit board to a sidewall of said chassis for grounding said capacitor.

14. The module according to claim 13, wherein a flexible circuit layer used as a return extends outwardly from each of two opposite sides of a rigid portion of said rigid flex printed circuit board to form grounding ears which each make a direct ground path from said rigid flex printed circuit board to respective ones of said two opposed sidewalls of said chassis to which said ground ears are directly connected.

15. A method of assembling an electronic module wherein at least one electrical component on a printed circuit board of the module is provided with a low impedance ground path, said method comprising providing a chassis for supporting a rigid flex printed circuit board; and supporting a rigid flex printed circuit board constructed of multiple circuit layers including flexible and rigid circuit layers on said chassis, said board being formed with at least one rigid portion having both flexible and rigid circuit layers and at least one flexible portion constructed of at least one flexible circuit layer, at least one electrical component to be grounded being located on a rigid portion of said board, and wherein a flexible circuit layer of said rigid flex printed circuit board is contacted with and connected to said chassis as a return making a direct ground path from the rigid flex printed circuit board to the chassis for grounding said electrical component.

16. The method according to claim 15, further comprising positioning said return on a fixturing member attached to said board before contacting and connecting said return to said chassis.

* * * * *